(12) United States Patent
Sekiguchi

(10) Patent No.: US 6,386,896 B2
(45) Date of Patent: *May 14, 2002

(54) SOCKET FOR ELECTRICAL PARTS

(75) Inventor: Toshihiko Sekiguchi, Kawaguchi (JP)

(73) Assignee: Enplas Corporation, Saitama-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/471,908

(22) Filed: Dec. 23, 1999

(30) Foreign Application Priority Data

Dec. 25, 1998 (JP) .......................................... 10-369388

(51) Int. Cl.⁷ .............................................. H01R 11/22
(52) U.S. Cl. .......................... 439/266; 439/72; 439/259
(58) Field of Search ........................ 439/72, 266, 259, 439/264, 265, 70, 71

(56) References Cited

U.S. PATENT DOCUMENTS 5,443,396 A * 8/1995 Tokushige .................. 439/266
5,713,751 A * 2/1998 Fukunaga .................. 439/266
5,936,418 A * 8/1999 Ideta et al. ................. 324/755
6,109,944 A * 8/2000 Takeyama .................. 439/266

* cited by examiner

Primary Examiner—P. Austin Bradley
Assistant Examiner—Alexander Gilman
(74) Attorney, Agent, or Firm—Fish & Richardson P.C.

(57) ABSTRACT

In a socket for an electrical part, an IC package is received in a socket body. A contact pin is provided for the socket body. The contact pin is formed with a movable contact piece having a movable side contact portion. The movable side contact portion is contacted to a terminal of the IC package and separated from the terminal. In the socket, in a state that the IC package is not received in the socket body, a bent portion is formed on a stationary side contact portion such as a mount portion of the stationary contact piece. The movable contact side portion is seated on the stationary side contact portion so that the movable side contact portion is adapted to be slid on the bent portion, thereby making longer a wiped width of the movable side contact portion.

16 Claims, 7 Drawing Sheets

SOCKET FOR ELECTRICAL PARTS

BACKGROUND OF THE INVENTION

1. Field of the Invention

The present invention relates to a socket for electrical parts or components for detachably holding an electrical part such as a semiconductor device (hereinafter, referred to as an "IC package").

More particularly, the present invention relates to a socket for electrical parts improved in a wiping effect of a contact pin contacted to a terminal of the electrical part and separated therefrom.

2. Relevant Art to the Invention

In a known art, as a conventional "socket for electrical parts" of this kind, there is provided an IC socket for detachably holding an IC package as "electrical part".

The IC package, which is called such as gull-wing type, is provided with a package body having a substantially rectangular parallelepiped structure and with a plurality of IC leads as "terminals". The plurality of IC leads project from two sides of the package body, which are opposite to each other, towards the side thereof so as to provide a crank shape.

On the other hand, the IC socket, partially as shown in FIG. 11, has a socket body 1 on which a receiving portion 1a is formed. The IC package is mounted on the receiving portion 1a so as to be received in the socket body 1. The IC socket is also provided with a plurality of contact pins 2 contacted to IC leads of the IC package. The contact pin 2 comprises a movable contact piece 3 and a stationary contact piece 4 and the movable contact piece 3 is formed with a movable side contact portion 3a which is contacted to an upper surface of the IC lead and separated therefrom. The stationary contact piece 4 is formed with a stationary side contact portion 4a which is contacted to an lower surface of the IC lead.

Moreover, an upper operation member is provided for the socket body so as to be movable vertically (upward and downward) with respect to the socket body. When the upper operation member is moved downward towards the socket body against the urging force of the movable contact piece 3 of the contact pin 2 or the like, an operation piece, which is not shown, of the movable contact piece 3 of the contact pin 2 is pressed outwardly by a cam portion. The pressed operation piece makes elastically deform a spring or elastic portion, which is not shown, of the movable contact portion 3 of the contact pin 2 so that the movable side contact portion 3a is moved away from the IC lead. In addition, when the upper operation member is moved upward, the movable side contact portion 3a is returned so as to be contacted on the upper surface of the IC lead, thereby pressing it. As a result, the IC lead is clamped by the movable side contact portion 3a and the stationary side contact portion 4a whereby the contact pin 2 and the IC lead are electrically conducted.

On the other hand, while the IC package is not mounted on the receiving portion 1a, as shown in FIG. 11, the movable side contact portion 3a is contacted to the stationary side contact portion 4a so that the stationary side contact portion 4a provides a seat portion of the movable side contact portion 3a. When the movable side contact portion 3a is contacted to the stationary side contact portion 4a, that is, when the elastically deformed movable contact portion 3 is returned so that the movable side contact portion 3a is contacted to the stationary side contact portion, the movable side contact portion 3a is slid on the stationary side contact portion 4a from a position, which is shown as a chain double-dashed line in FIG. 11, to a position, which is shown as a solid line in FIG. 11, by a distance L1. Thus, the contact portion A of the movable side contact portion 3a to the stationary side contact portion 4a is slid by the distance L1 so that a solder adhering to the movable side contact portion 3a by contacting the IC lead is wiped (eliminated).

The effect of wiping the solder adhering to the movable side contact portion 3a is improved by adjusting a roughness of the upper surface of the stationary side contact portion 4a.

However, in the conventional socket described above, because the contact portion A of the movable side contact portion 3a is lineally contacted to the stationary side contact portion 4a and the upper surface of the stationary side contact portion 4a is made flat, even if the movable side contact portion 3a is slid on the stationary side contact portion 4a, the contact portion A is only wiped, and accordingly, there is a possibility that the wiping effect is achieved in only the extremely short area.

SUMMARY OF THE INVENTION

An object of the present invention is to eliminate defects or drawbacks encountered in the prior art mentioned above and to provide a socket for electrical parts, which is capable of making longer a wiped width of the movable side contact portion.

In order to achieve such object, according to one aspect of the present invention, there is provided a socket for an electrical part comprising:

a socket body in which an electrical part is received;

a contact pin provided for the socket body and formed with a movable contact piece, the movable contact piece being provided with a first contact portion at one end thereof, the first contact portion being contacted to a terminal of the electrical part or separated therefrom;

a mount (seat) portion on which, without the electrical part being received in the socket body, the first contact portion is mounted; and a bent portion formed on the seat portion so that the first contact portion is adapted to be slid on the bent portion.

According to this aspect of the present invention, since the bent portion is formed on the mount portion on which the first contact portion is seated so that the first contact portion is adapted to be slid on the bent portion, thereby wiping the solder adhering to the first contact portion, it is possible to make longer the wiped width of the first contact portion, the wiped width of the first contact portion ranging over a long distance.

In preferred embodiment of this aspect, the terminal has one surface and other surface opposite to the one surface, the first contact portion has one surface contacted to the one surface of the terminal and separated therefrom, the contact pin is provided with a stationary contact piece having a second contact portion at one end thereof, the second contact portion having one surface contacting to the other surface of the terminal, and wherein the mount portion is formed on the one surface of the second contact portion.

A preferred embodiment of this aspect further comprises an operation member provided for the socket body so as to be movable with respect to the socket body, and the socket body has a receiving portion on which the electrical part is mounted to be received, the movable contact piece is moved towards the receiving portion of the socket body or withdrawn therefrom in accordance with the movement of the operation member, the first contact portion of the movable contact piece being slid on the bent portion while the movable contact piece is moved towards the receiving portion.

According to these preferred embodiments of this aspect of the present invention, the mount portion is formed on the one surface of the second contact portion of the stationary contact piece, making it possible to wipe the first contact portion by the slide between the first and second contact portions.

This aspect of the present invention has an arrangement that the mount portion is formed on the socket body.

According to the arrangement of this aspect of the present invention, even in the case where the contact pin having, that is, the one-point contact structure, it is possible to make longer the wiped width of the first contact portion.

This aspect of the present invention has an arrangement that the bent portion is a convex portion formed on one surface of the mount portion on which the first contact portion of the movable contact piece is contacted.

According to the arrangement of this aspect of the present invention, it is possible to increase the contact pressure between the convex portion and the first contact portion, thereby further improving the wiping effect of wiping by the convex portion the solder adhering to the first contact portion.

In preferred embodiment of this aspect, the convex portion has a substantially arc shape in substantially vertical cross section thereof along a sliding direction of the first contact portion of the movable contact piece.

According to the preferred embodiment of this aspect of the present invention, because the convex portion has a substantially arc shape in substantially vertical cross section thereof along a sliding direction of the first contact portion, it is possible to decrease a change of the resistance of the slide, thereby smoothly wiping the first contact portion.

In a preferred embodiment of this aspect, the convex portion has a substantially V-shape in substantially vertical cross section thereof along a sliding direction of the first contact portion.

According to the preferred embodiment of this aspect of the present invention, since the convex portion has a substantially triangular shape in substantially vertical cross section thereof along a sliding direction of the first contact portion, it is possible to efficiency wipe the solder adhering to the first contact portion of the contact pin by an uppermost pointed edge portion of the convex portion, thereby exhibiting a practically useful effect for improving the wiping effect.

This aspect of the present invention has an arrangement that the bent portion is a concave portion formed on one surface of the mount portion on which the first contact portion of the movable contact piece is contacted.

In accordance with the arrangement of this aspect of the present invention, since the first contact portion is intruded in the concave portion to make it possible to prevent the first contact portion from moving inside the socket body. As a result, when the movable contact piece is subjected to an external force from an outside of the movable contact piece to an inside thereof, it is possible to prevent the movable contact piece from coming off towards the inside thereof.

In preferred embodiment of this aspect, the concave portion has a substantially arc shape in substantially vertical cross section thereof along a sliding direction of the first contact portion.

According to the preferred embodiment of this aspect, because the concave portion has a substantially arc shape, it is possible to decrease a change of the resistance of the slide, thereby smoothly wiping the first contact portion.

This aspect of the present invention has an arrangement that the concave portion has a substantially triangular shape in substantially vertical cross section thereof along a sliding direction of the first contact portion.

BRIEF DESCRIPTION OF THE DRAWINGS

Other objects and aspects of the present invention will become apparent from the following description of embodiments with reference to the accompanying drawings in which.

DESCRIPTION OF THE PREFERRED EMBODIMENTS

Figure 1:
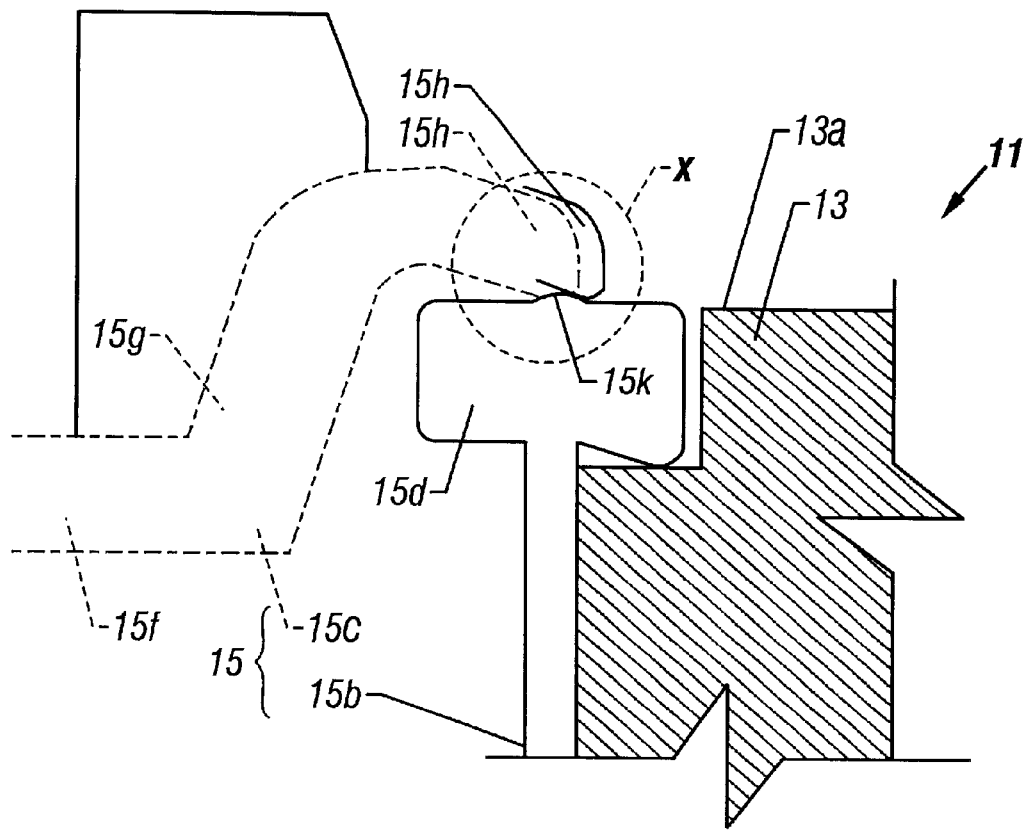
FIG. 1 is an enlarged view showing main parts of an IC socket according to a first embodiment of the present invention.

The preferred embodiments of the present invention will be described hereinafter with reference to the accompanying drawings.

[First Embodiment 1]

FIG. 1 to FIG. 6 show a first embodiment of the present invention.

Referring first to a structure of the first embodiment, reference numeral 11 in the drawings represents an IC socket as "socket for electrical parts". For carrying out a performance test of an IC package as "electrical part", the IC socket 11 is adapted to electrically connect an IC lead 12b as "terminal" of the IC package 12 to a printed circuit board (not shown) of a tester.

Figure 3:
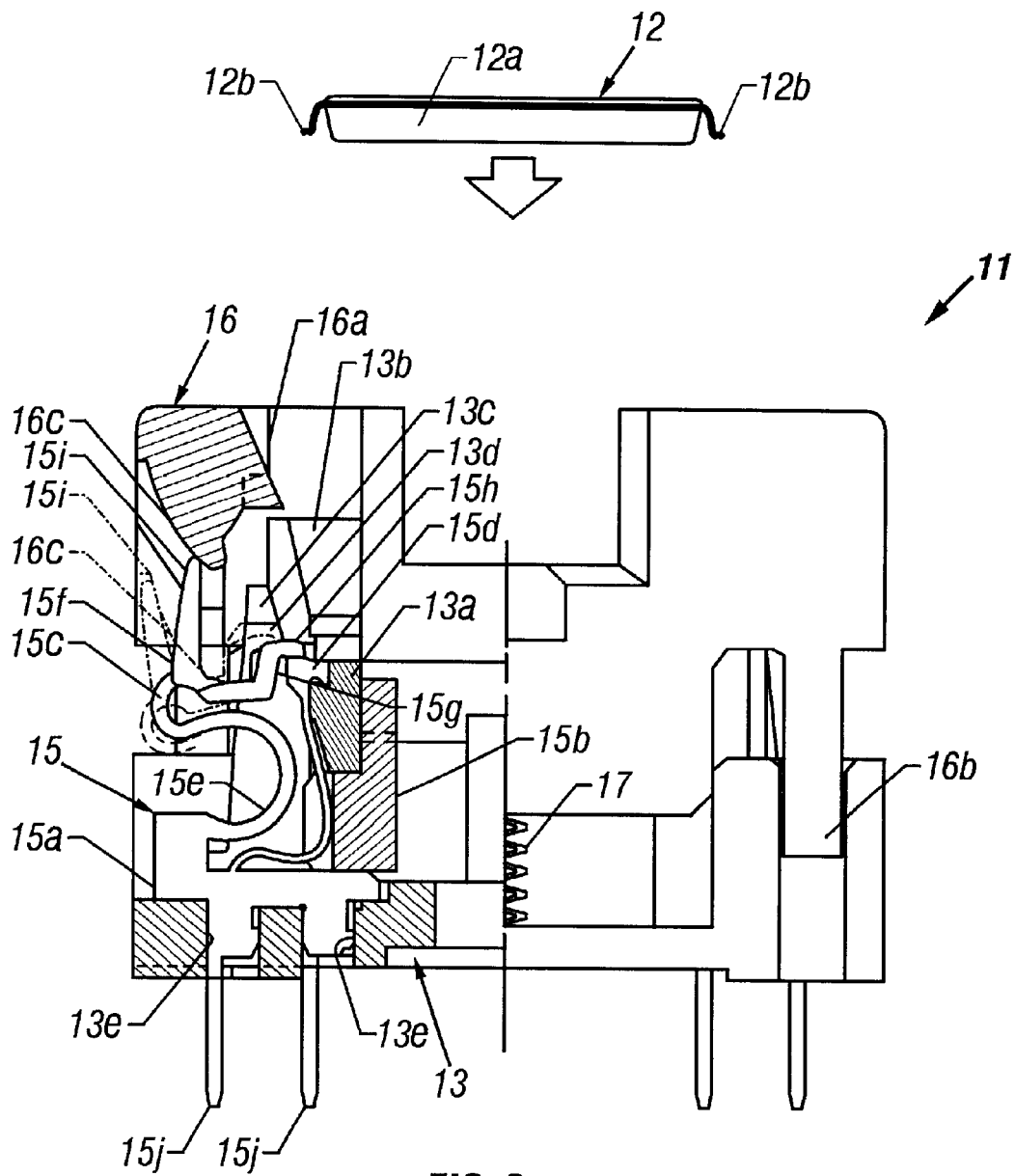
FIG. 3 is a view showing the IC socket, half in section, according to the first embodiment.

The IC package 12, as shown in FIG. 3, is called as gull-wing type. The gull-wing type of the IC package 12 is provided with a package body 12a having a rectangular shape and with a plurality of IC leads 12b each projecting from two sides of the package body 12a, which are opposite to each other, towards the side thereof so as to be shaped as a crank.

On the other hand, schematically, the IC socket 11 is provided with a socket body 13 mounted on the printed circuit board. On the socket body 13, a receiving portion (IC package accommodation portion or mount portion) 13a on which the IC package 12 is mounted to be received is formed. Guide portions 13b are mounted on the socket body 13 in correspondence with corner portions of the IC package 12a, respectively. Moreover, separation wall sections 13c are formed between the respective guide portions 13b on two sides of the socket body 13 which are opposite to each other around the receiving portion 13a. Each of the separation wall sections 13c is formed with a plurality of slits 13d which are apart from each other at predetermined intervals.

For the socket body 13, a plurality of contact pins 15 are provided. Each of the contact pins 15 is capable of being elastically deformed so that each contact pin 15 is contacted to each IC lead 12b and separated therefrom. An upper operation member 16 having a shape of a rectangular frame is mounted on the socket body 13 so as to be movable vertically with respect to the socket body 13. The vertical movement of the upper operation member 16 makes the contact pins 15 elastically deform.

The contact pin 15, as shown in FIG. 3 or the like, has an elasticity or springy property and is made of a material having a superior conductivity. The contact pin 15 is pressed to fit in the socket body 13 so as to be arranged on the outside of the receiving portion 13a of the socket body 13.

In detail, in a state of being provided for the socket body 13, the contact pin 15 is formed at a lower end with a fixed portion 15a fixed to the socket body 13 so that lower ends of the fixed portion 15a are pressed to fit in opening portions of the socket body 13. The contact pin 15 is also provide at the fixed portion 15a with a stationary contact piece 15b and a movable contact piece 15c each of which projects upward from the fixed portion 15a.

The stationary contact piece 15b is formed at its upper end with a stationary side contact portion 15d which is contacted to a lower surface of the IC lead 12b.

The movable contact piece 15c is provided with a spring portion 15e mounted on the fixed portion 15a. The spring portion 15e is curved to be shaped as an arc. The movable contact piece 15c is provided with a horizontal portion 15f at an upper side of the spring portion 15e. The horizontal portion 15f horizontally extends towards a center side of the socket body 13. The movable contact piece 15c is also provided with an inclined portion 15g formed on a center side end of the horizontal portion 15f so as to extend obliquely upwardly therefrom. Moreover, the movable contact piece 15c is provided with a movable side contact portion 15h horizontally extending from the upper end portion of the inclined portion 15g towards the center side of the socket body 13. When the movable side contact portion 15h is contacted to an upper surface of the IC lead 12b so as to depress it, the IC lead 12b is adapted to be clamped by the movable side contact portion 15h and the stationary side contact portion 15d of the stationary contact piece 15b. Furthermore, the contact pin 15 is provided at the upper side of the spring portion 15e with an operation piece 15i which branches from the horizontal portion 15f so as to extend upwardly. The operation piece 15i is adapted to be pressed by the upper operation member 16 described in detail hereinlater. In addition, the contact pin 15 is provided with lead portions 15j formed on a lower side of the fixed portion 15a. The lead portion 15j is electrically connected to the printed circuit board (not shown).

Furthermore, the stationary side contact portion 15d provides a "seat portion" on which, when the IC package 12 is not mounted on the receiving portion 13a, the movable side contact portion 15h is seated. On the stationary side contact portion 15d, as shown in FIG. 1, a convex portion 15k is formed as a "bent portion". The convex portion 15k is arranged so that the movable side contact portion 15h is slid thereon. The convex portion 15k has a substantially arc shape in its substantially vertical cross section along the sliding direction of the movable side contact portion 15h.

Figure 4:
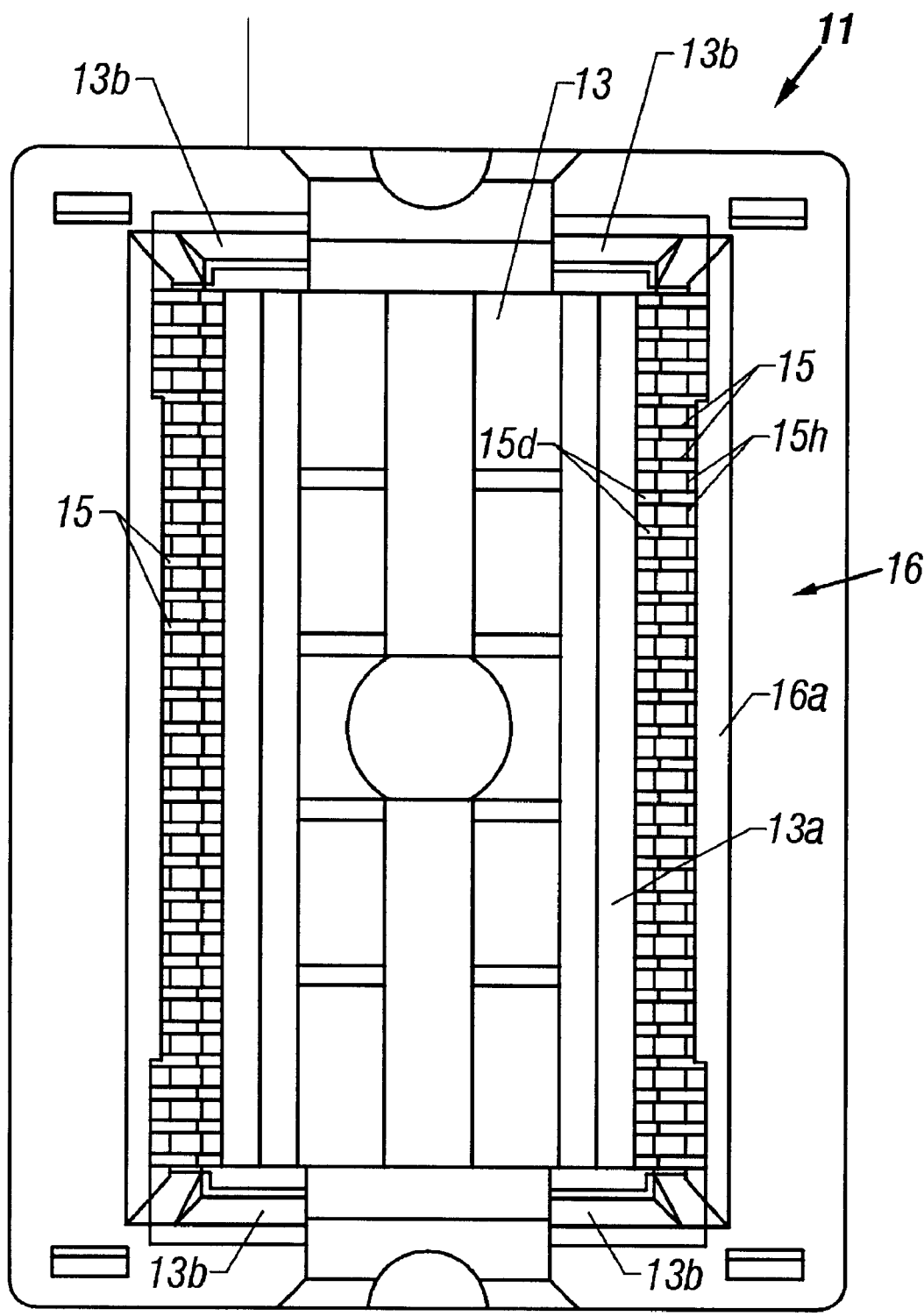
FIG. 4 is a plan view showing the IC socket according to the first embodiment.
Figure 5:
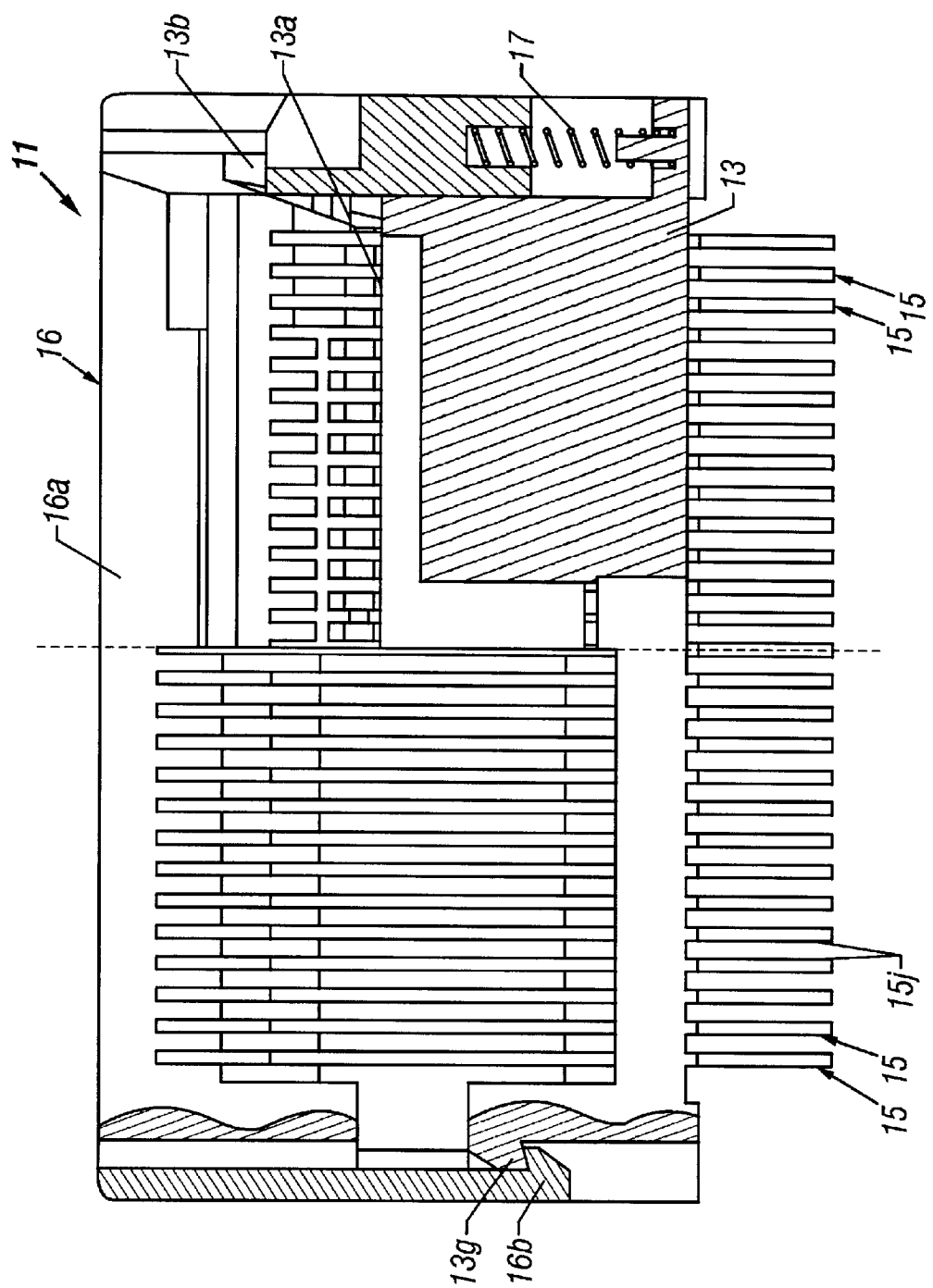
FIG. 5 is a view showing the IC socket, half in section, according to the first embodiment.

On the other hand, the upper operation member 16, as shown in FIG. 3 to FIG. 5 and so on, has a shape of a rectangular flame corresponding to the shape of the IC package 12 and is provided with an opening 16a (an opening of the IC socket) having a predetermined area which allows the IC package 12 to be inserted therein. The IC package 12 is inserted through the opening 16a so as to be mounted on the receiving portion 13a of the socket body 13. The upper operation member 16 is arranged to be movable vertically with respect to the socket body 13 and is urged upward by a coil spring 17.

The upper operation member 16 has a pair of engagement pieces 16b so that, when the operation member 16 is moved uppermost, the pair of engagement pieces 16b of the upper operation member 16 is engaged with a pair of engagement portions 13g of the socket body 13 thereby preventing the upper operation member 16 from being dislocated on the socket body 13.

Furthermore, the upper operation member 16 is formed with a cam portion 16c slidably contacting to the operation piece 15i of the contact pin 15, and when the upper operation member 16 is moved downward, the operation piece 15i of the contact pin 15 is pressed by the cam portion 16c so that the spring portion 15e is elastically deformed, whereby the movable side contact portion 15h is obliquely upwardly displaced towards an outside of the socket body 13.

Next, an operation of the IC socket 11 of the first embodiment will now be explained hereinafter.

At first, the lead portions 15j of the contact pin 15 of each of the IC sockets 11 are inserted into through holes of the printed circuit board so as to be soldered thereto, whereby the IC sockets 11 are mounted on the printed circuit board.

Next, the IC packages 12 are set on the IC sockets 11, respectively, by using an automatic machine, described hereinafter, so as to be electrically connected thereto.

Incidentally, the setting manner is explained hereunder about one of the IC packages 12 with respect to corresponding one of the IC sockets 11, as one example. However, the setting manners about other IC packages 12 with respect to corresponding other IC sockets 11 are the same as the setting manner described hereinlater.

That is, while the IC package 12 is held by the automatic machine, the upper operation member 16 is depressed against the urging force of the contact pin 15 so as to be moved downward. By the downward movement of the upper operation member 16, the operation piece 15i of the contact pin 15 is pressed by the cam portion 16c of the upper operation member 16 so that the spring portion 15e of the contact pin 15 is elastically deformed. The elastic deform of the spring portion 15e displaces the movable side contact portion in an obliquely upward direction towards the outside of the socket body 13 so that the movable side contact portion 15h is opened maximum, whereby the movable side contact portion 15h is withdrawn from an insertion area of the IC package 12, the withdrawn movable side contact portion 15h being shown as a chain double-dashed line in FIG. 1.

Next, when the pressing force of the upper operation member by the automatic machine is released, the upper operation member 16 is moved upward by the elastic forces of the spring portion 15e of the movable contact piece 15c and the coil spring 17 so that the elastic force of the spring portion 15e returns the movable side contact portion 15h towards the insertion area of the IC package 12.

When the upper operation member 16 is moved at a predetermined height position, the movable side contact portion 15h of the contact pin 15 is contacted to the upper surface of the IC lead 12b which is positioned on the receiving portion 13a of the socket body 13, thereby being electrically connected to the IC lead 12b.

Thus, the movable side contact portion 15h is contacted to the IC lead 12b so that the solder adhering to the IC lead 12b is spread on the movable side contact portion 15h so as to be adhering thereto. However, the adhering solder on the movable side contact portion 15h is wiped to be eliminated by a wiping manner described hereunder.

Figure 2:
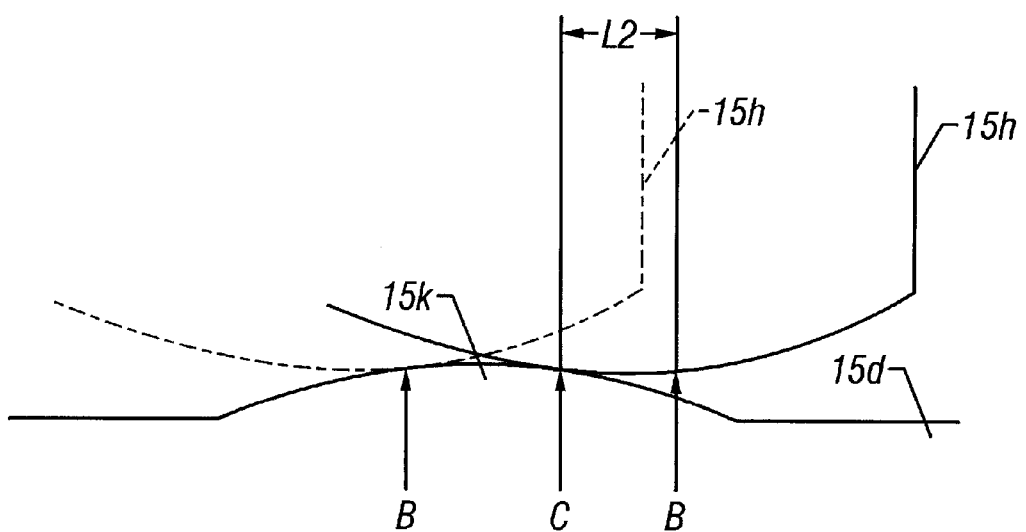
FIG. 2 is an enlarged view showing an X portion in FIG. 1 according to the first embodiment.

That is, when the IC package 12 is not mounted on the receiving portion 13a of the socket body 13, while the upper operation member 16 is moved upward from the position at which the movable contact portion 15d is opened to a position at which the movable side contact portion 15h is contacted to the stationary side contact portion 15d, the movable side contact portion 15h moves in an arc by the elastic force of the spring portion 15e so that, as shown in FIG. 1 and FIG. 2, the movable side contact portion 15h is slid on the convex portion 15d of the stationary side contact portion 15d. Because the movable side contact portion 15h is slid on the convex portion 15k, it is possible to make longer a wiped width of the movable side contact portion 15h than that of the movable side contact portion of the conventional IC socket.

That is, as shown in FIG. 2, when the movable side contact portion 15h is first contacted to the convex portion 15k, which is shown as a chain double-dashed line in FIG. 2, the movable side contact portion 15h is contacted at its one portion B to the convex portion 15k, and when the movable side contact portion 15h is slid on the convex portion 15k by a predetermined distance, which is shown as a solid line in FIG. 2, the movable side contact portion 15h is contacted at its other portion C to the convex portion 15k. Therefore, the wiped width L2 of the movable side contact portion 15h is a length determined from the B portion to the C portion, making it possible to make longer the wiped width L2 of the movable side contact portion 15h than that of the movable side contact portion of the conventional IC socket.

Moreover, as the "bent portion", the convex portion 15k is formed so that, when the movable side contact portion 15h is slid over the convex portion 15k, it is possible to increase the contact pressure between the convex portion 15k and the movable side contact portion 15h, thereby further improving the wiping effect of wiping by the convex portion 15k the solder adhering to the movable side contact portion 15h.

Figure 6:
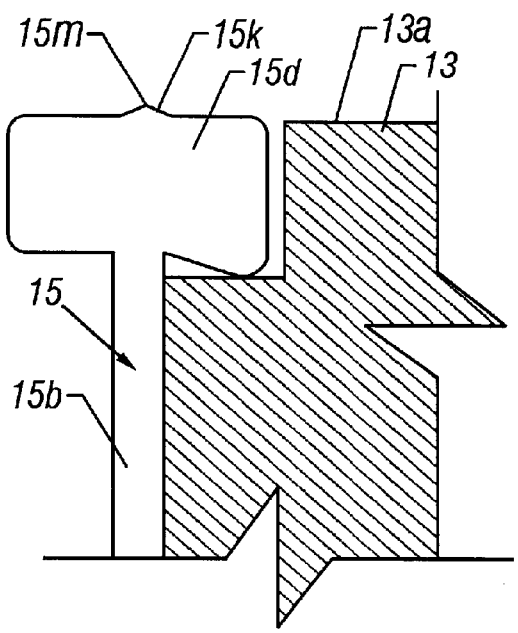
FIG. 6 is a view showing a movable side contact portion and so on according to a modification of the first embodiment.

Incidentally, in this embodiment, the convex portion 15k is formed as the arc-shape, but the present invention is not limited to such structure. That is, as shown in FIG. 6, the convex portion may have a peak-shape formed as an approximately triangular shape, that is, an approximately V-shape in its substantially vertical cross section along the sliding direction of the movable side contact portion 15h. In this structure, because the convex portion 15k includes an uppermost pointed edge portion 15m having a peak-shape, the solder adhered to the movable side contact portion 15h is effectively eliminated by the uppermost pointed edge portion 15m so that it is possible to further improve the above wiping effect.

[Second Embodiment 2]

Figure 7:
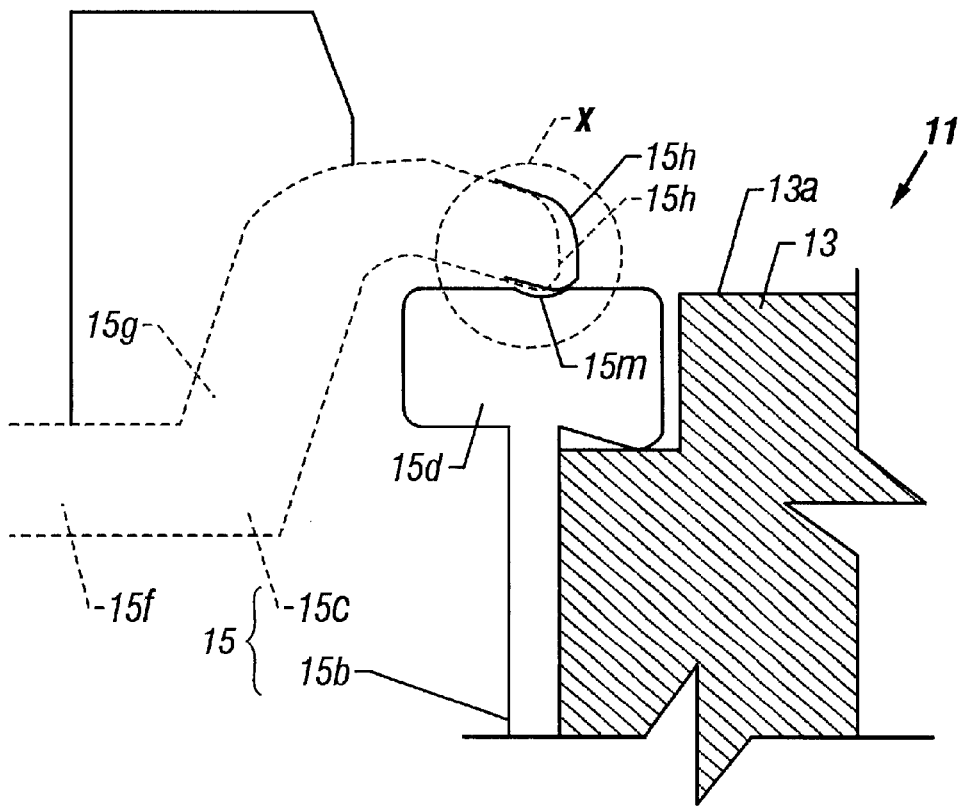
FIG. 7 is an enlarged view corresponding to FIG. 1 according to a second embodiment of the present invention.
Figure 8:
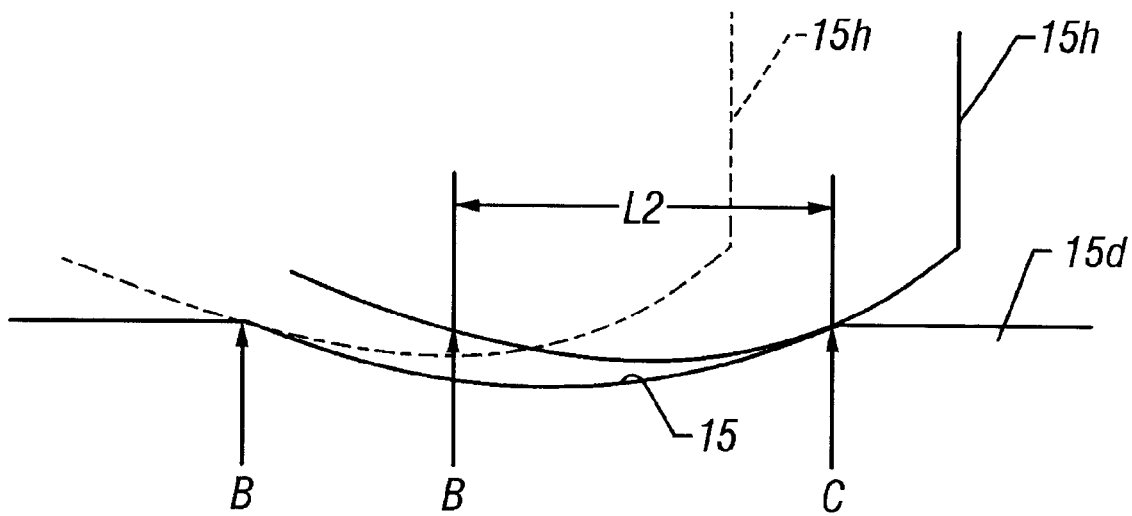
FIG. 8 is an enlarged view according to the second embodiment.

FIG. 7 and FIG. 8 show a second embodiment of the present invention.

In the above first embodiment, the convex portion 15k is formed as the "bent portion", but, in this second embodiment, as the "bent portion", a concave portion 15n is formed on the stationary side contact portion 15d. The concave portion 15n has a substantially arc shape in its approximately vertical cross section along the sliding direction of the movable side contact portion 15h.

In this structure, as shown in FIG. 8, the movable side contact portion 15h is first contacted at its one portion B to the concave portion 15n, and thereafter, the movable side contact portion 15h moves towards the right side in FIG. 8, whereby the movable side contact portion 15h is secondarily contacted at its other portion C to the concave portion 15n.

Therefore, it is possible for the concave portion 15n to wipe the solder adhering to the movable side contact portion 15h while the movable side contact portion 15n moves by a long distance L2 determined from the B part to the C part.

In addition, the movable side contact portion 15h is intruded in the concave portion 15n to make it possible to prevent the movable side contact portion 15h from moving inside the socket body 13. As a result, in a case where the movable contact piece 15c is subjected to an external force from an outside of the movable contact piece 15c to an inside thereof, it is possible to prevent the movable piece 15c from coming off towards the inside of the contact piece Other structures and operations of this embodiment are the same as those of the first embodiment and therefore, the descriptions of the other structures and operations of the second embodiment are herein omitted.

Incidentally, in this embodiment, the concave portion 15n is formed as the arc-shape, but the present invention is not limited to the structure.

Figure 9:
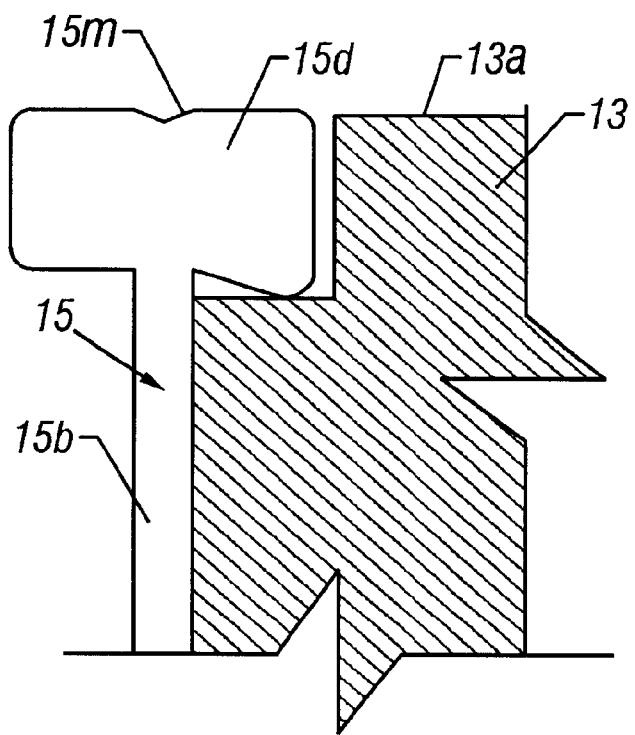
FIG. 9 is a view corresponding to the FIG. 6 according to the second embodiment of the present invention.

That is, as shown in FIG. 9, the convex portion may have an approximately triangular shape, that is, a substantially V-shape in its substantially vertical cross section along the sliding direction of the movable side contact portion 15h.

[Third Embodiment of the present invention]

Figure 10:
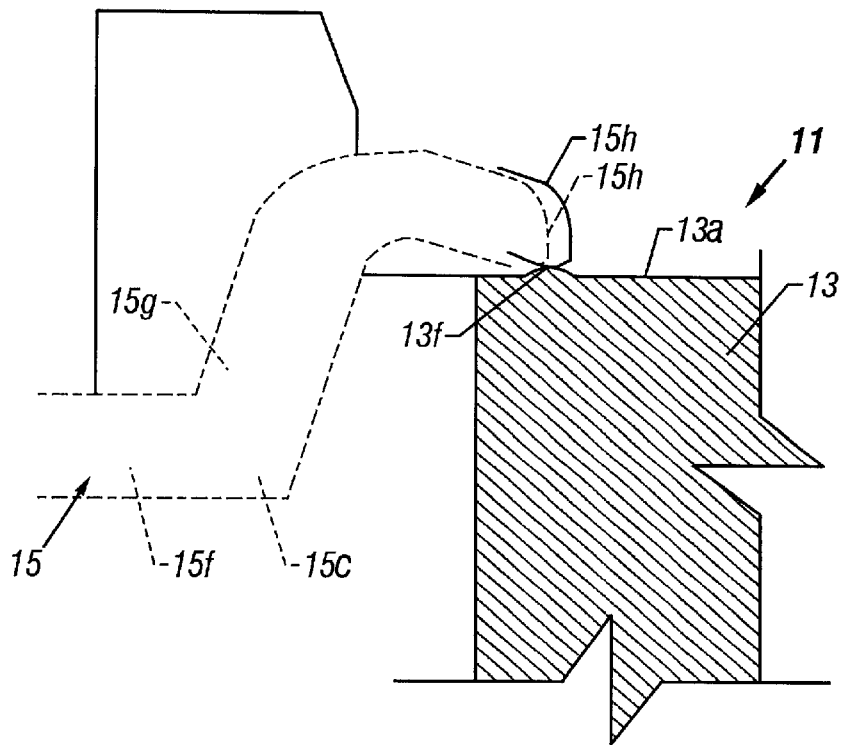
FIG. 10 is a view corresponding to FIG. 1 according to a third embodiment of the present invention.
Figure 11:
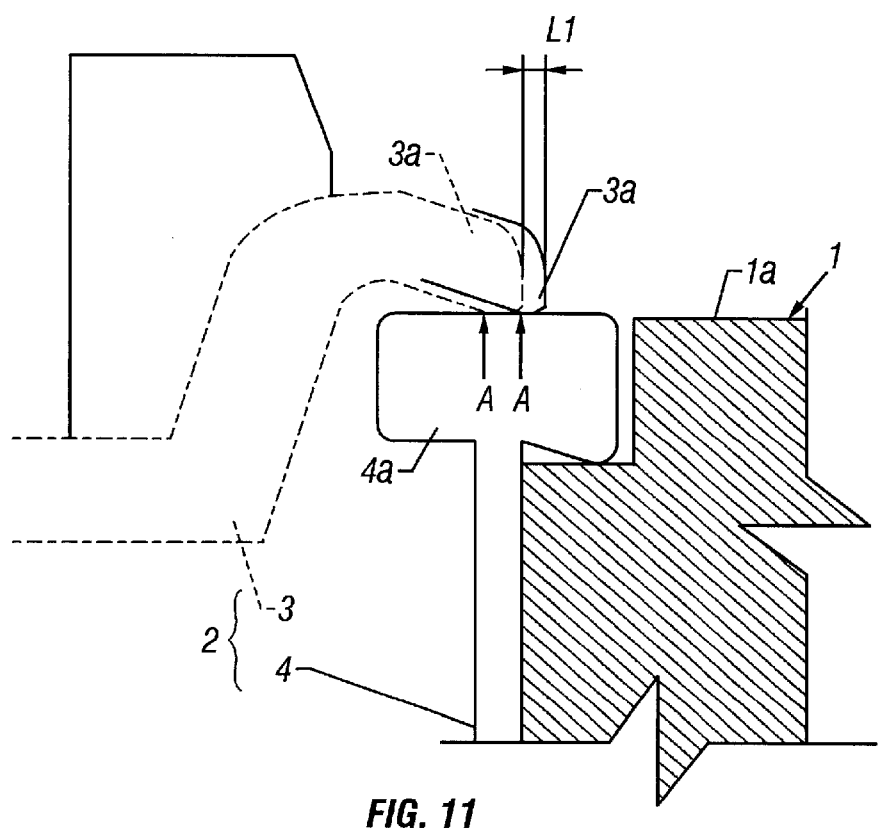
FIG. 11 is a view corresponding to FIG. 1 showing a conventional IC socket.
Figure 1:
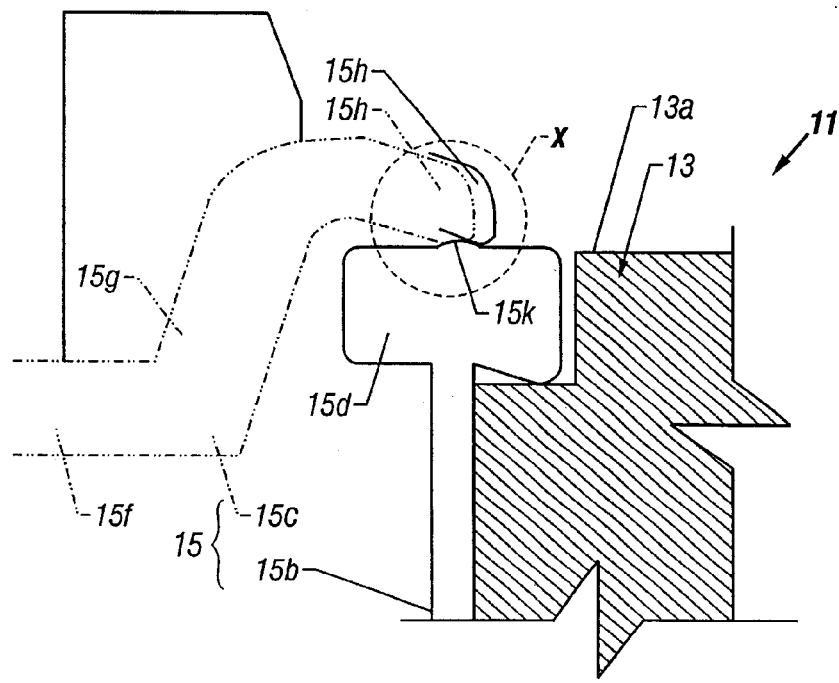
Figure 2:
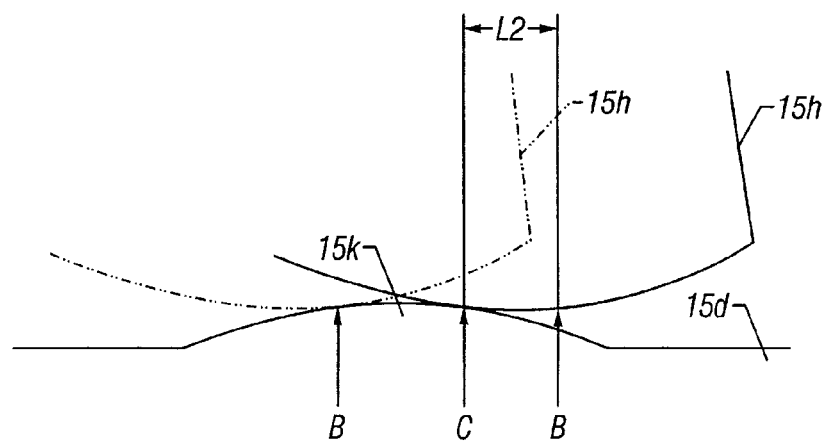
Figure 3:
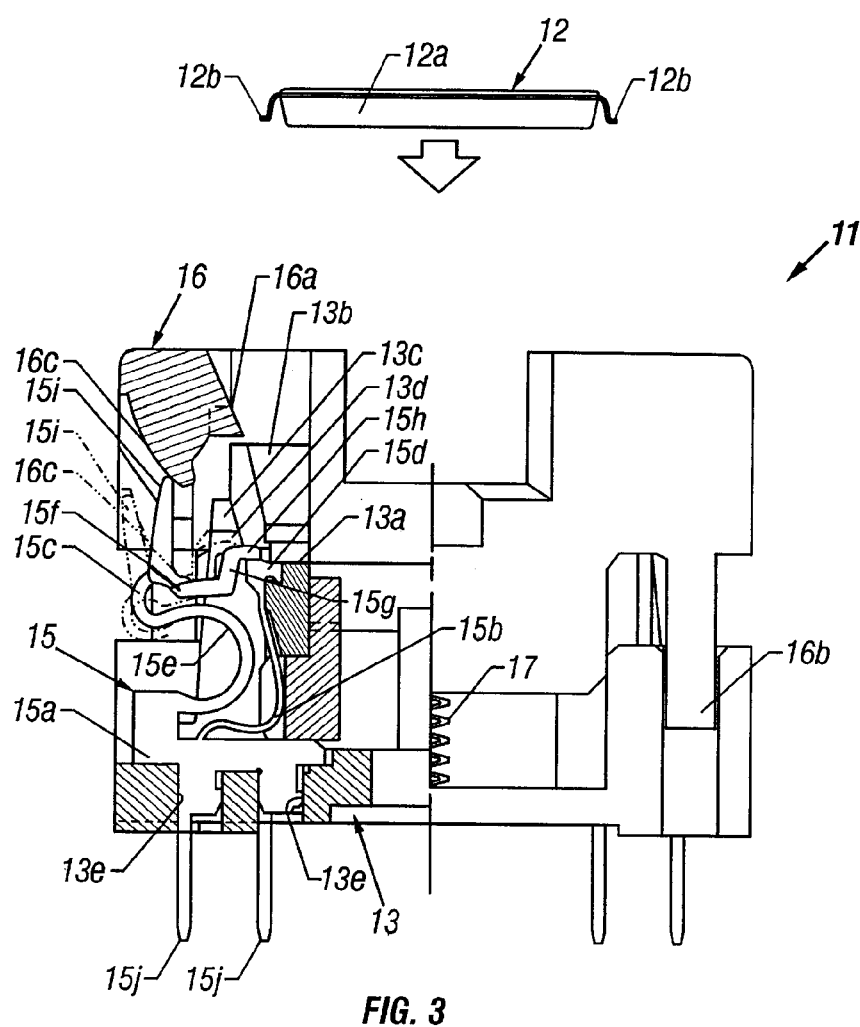
Figure 4:
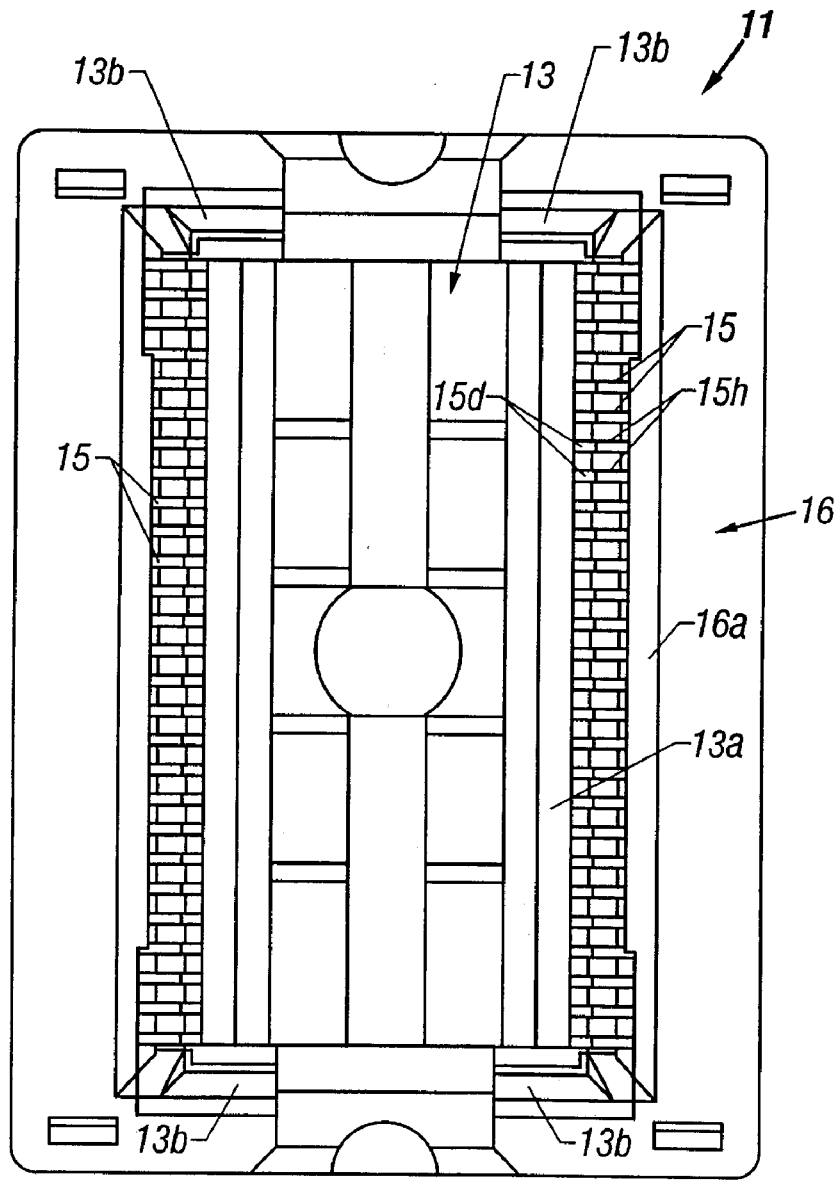
Figure 5:
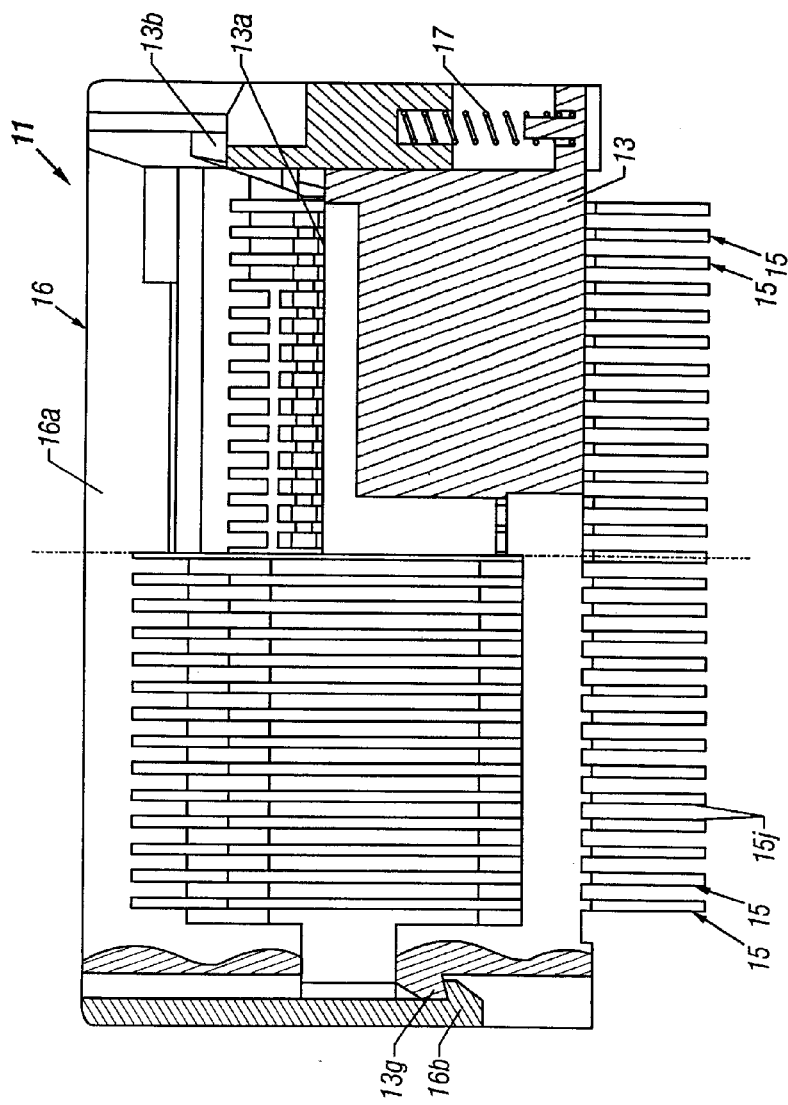
Figure 6:
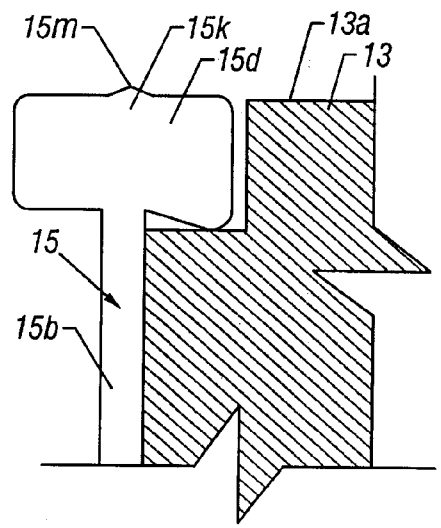
Figure 7:
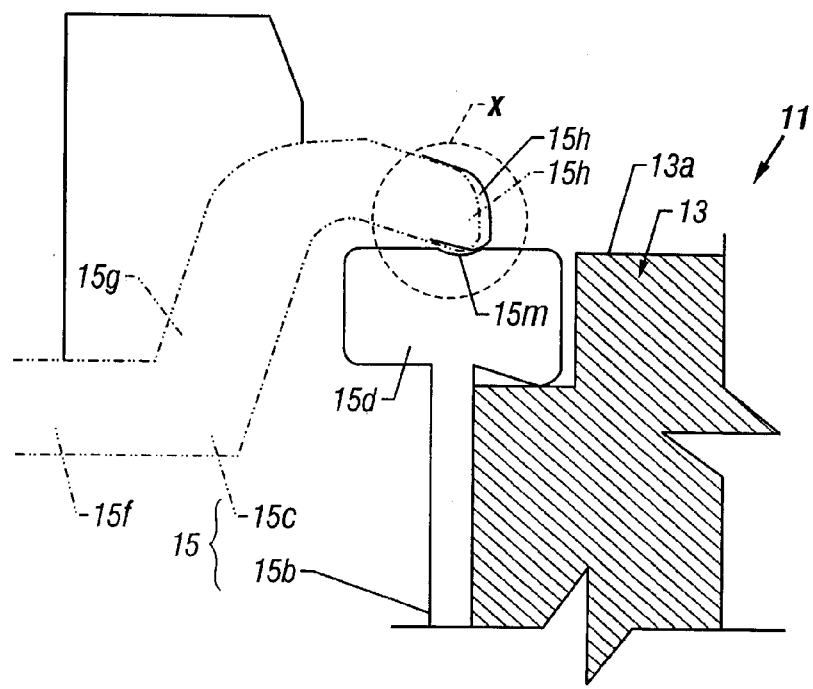
Figure 8:
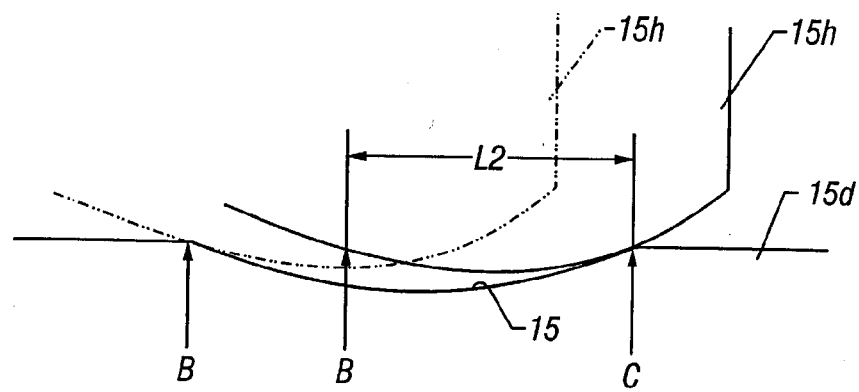
Figure 9:
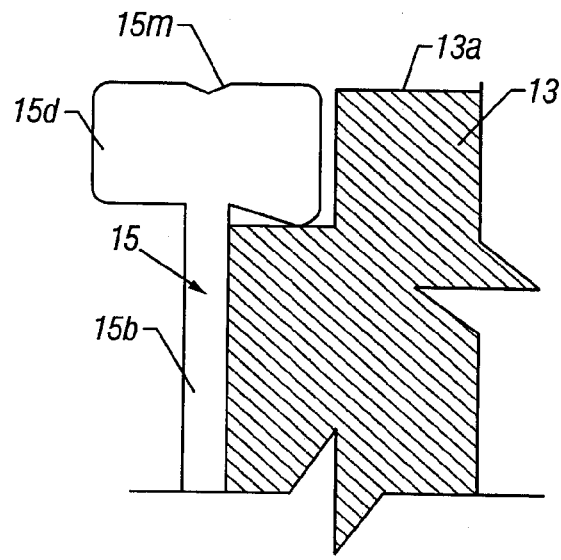
Figure 10:
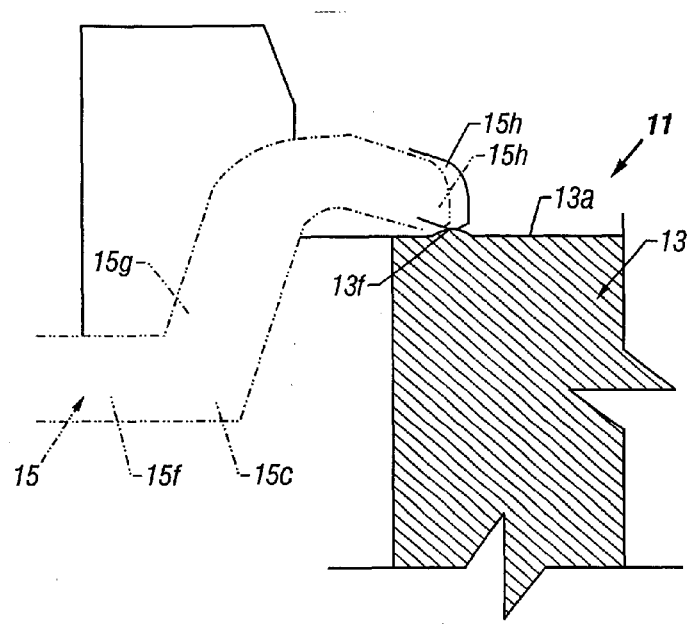
Figure 11:
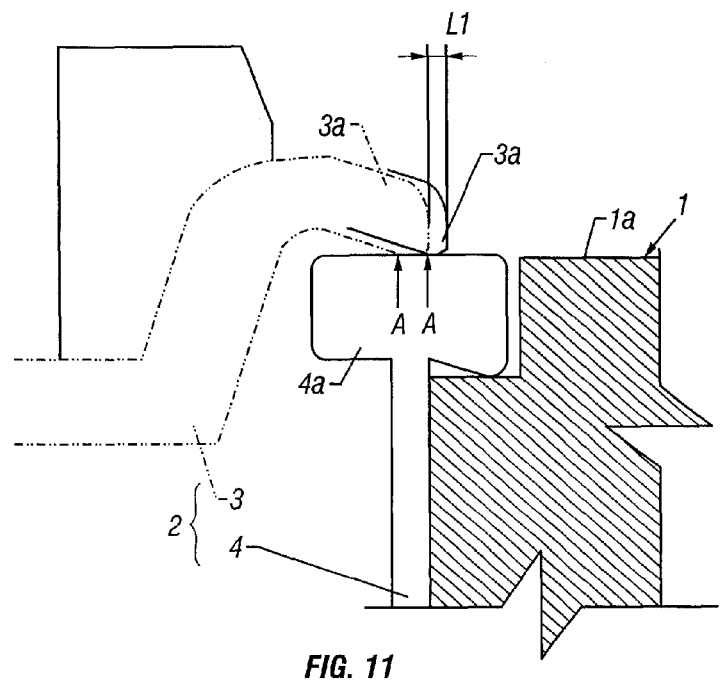

FIG. 10 shows a third embodiment of the present invention.

In the above first and second embodiments, the contact pin 15 has the stationary contact piece 15b and the movable contact piece 15c, that is, has the two-points contact structure wherein the movable contact piece 15c is contacted, as first point, to the stationary contact portion 15b and the stationary contact portion 15b is contacted, as second point, to the IC lead. In the third embodiment, however, the contact pin 15 is not provided with the stationary contact piece 15b but has only the movable contact portion 15c. That is, the contact pin 15 has a one-point contact structure wherein the movable contact piece 15c is contacted, as one point, to the IC lead.

Therefore, in this embodiment, "seat portion" of the movable side contact portion 15h is the receiving portion 13a of the socket body 13, and on the receiving portion 13a, the convex portion 13f having an arc shape is formed as the "bent portion".

Even in this structure of the third embodiment, the slide of the movable side contact portion 15h on the convex portion 13f allows the wiped width L2 of the movable side contact portion 15h to be long, similarly to the first embodiment. To be sure, the convex portion 13f may have a peak-shape formed as a substantially triangular shape (V-shape), or as the bent portion of this third embodiment, a concave portion having an arc shape or a triangular shape (V-shape) may be formed on the receiving portion 13a.

Other structures and operations of this embodiment are the same as those of the first embodiment and therefore, the descriptions of the other structures and operations of the second embodiment are omitted.

Incidentally, in each of the embodiments described above, the present invention is applied to the IC socket as "socket for electrical parts", but the present invention is not limited to other devices. Moreover, in each of the embodiments, the present invention is applied to the IC package having IC leads each projecting from two opposite sides of the package body, but the present invention is not limited to the IC package. That is, the present invention is applied to an IC package having IC leads each projecting from four sides of the package body. Furthermore, in the present invention, the shape of the IC lead 12b (terminal) is not limited to the gull-wing shape. Namely, to be sure, the present invention is applied to a straight type of IC package including the IC leads each having a straight shape.

It is to be noted that the present invention is not limited to the described embodiment and many other changes and modifications may be made without departing from the scopes of the appended claims.

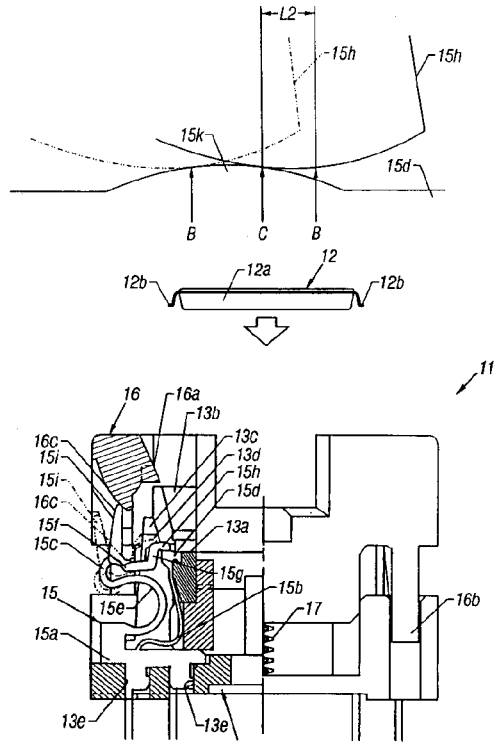

What is claimed is:

1. A socket for an electrical part comprising:
    a socket body in which the electrical part is received;
    a contact pin provided for the socket body and formed with a movable contact piece, said movable contact piece being provided with a first contact portion at one end thereof, said first contact portion being contacted to a terminal of the electrical part or separated therefrom, said terminal has one surface and a second surface opposite to the one surface, said first contact portion has one surface contacted to the one surface of the terminal or separated therefrom, said contact pin is provided with a stationary contact piece having a second contact portion at one end thereof, said second contact portion having one surface contacting to the second surface of the terminal;
    a mount portion formed on the one surface of the second contact portion, said mount portion with which, without the electrical part being received in the socket body, the first contact portion is engaged; and
    a curved surface formed on a part of the mount portion so that the first contact portion is adapted to be slid on the curved surface, the mount portion having a substantially plain surface in a portion other than the curved surface, thereby making longer a wiped width of the movable contact piece.

2. A socket for an electrical part according to claim 1, further comprising an operation member provided for the socket body so as to be movable with respect to the socket body, and wherein said socket body has a receiving portion on which the electrical part is mounted to be received, said movable contact piece is moved towards the receiving portion of the socket body or withdrawn therefrom in accordance with the movement of the operations member, said first contact portion of the movable contact piece being slid on the curved surface while the movable contact piece being moved towards the receiving portion.

3. A socket for an electrical part according to claim 1, where said curved surface is a convex surface, said convex surface having a substantially triangular shape in substantially vertical cross section thereof along a sliding direction of the first contact portion.

4. A socket for an electrical part according to claim 1, wherein said curved surface is a concave surface, said concave surface having a substantially arc shape in substantially vertical cross section whereof along a sliding direction of the first contact portion.

5. A socket for an electrical part according to claim 1, wherein said curved surface is a concave surface, said concave surface having a substantially triangular shape in substantially vertical cross section thereof along a sliding direction of the first contact portion.

6. A socket for an electrical part comprising:
    a socket body in which an electrical part is received;
    a contact pin provided for the socket body and formed with a movable contact piece, said movable contact piece being provided with a first contact portion at one end thereof, said first contact portion being contacted to a terminal of the electrical part or separated therefrom;
    a mount portion of the contact pin with which, without the electrical part being received in the socket body, the first contact portion is engaged; and
    a convex surface formed on a substantially flat top surface of the mount portion on which the first contact portion of the movable contact piece is contacted so that the first contact portion is adapted to be slid on the convex surface, thereby making longer a wiped width of the movable contact piece.

7. A socket for an electrical part according to claim 6, where said convex surface has a substantially arc shape in substantially vertical cross section thereof along a sliding direction of the first contact portion of the movable contact piece.

8. A socket for an electrical part according to claim 6, wherein said convex surface has a substantially triangular shape in substantially vertical cross section thereof along a sliding direction of the first contact portion.

9. A socket for an electrical part comprising:
    a socket body in which an electrical part is received;
    a contact pin provided for the socket body and formed with a movable contact piece, said movable contact piece being provided with a first contact portion at one end thereof, said first contact portion being contacted to a terminal of the electrical part or separated therefrom;
    a mount portion of the contact pin with which, without the electrical part being received in the socket body, the first contact portion is engaged; and
    a concave surface formed on a substantially flat top surface of the mount portion on which the first contact portion of the movable contact piece is contacted so that the first contact portion is adapted to be slid on the concave surface, thereby making longer a wiped width of the movable contact piece.

10. A socket for an electrical part according to claim 9, wherein said concave surface has a substantially arc shape in substantially vertical cross section thereof along a sliding direction of the first contact portion.

11. A socket for an electrical part according to claim 9, wherein said concave surface has a substantially triangular shape in substantially vertical cross section thereof along a sliding direction of the first contact portion.

12. A socket for an electrical part according to claim 1, wherein said curved surface is a convex surface, said convex surface having a substantially arc shape in substantially vertical cross section thereof along a sliding direction of the first contact portion of the movable contact piece.

13. A socket for an electrical part comprising:
    a socket body in which an elected part is received;
        a contact pin provided for the socket body and formed with a movable contact piece, said movable contact piece being provided with a first contact portion at one end thereof, said first contact portion being contacted to a terminal of the electrical part or separated therefrom;

a mount portion of the contact pin disposed on the socket body, said mount portion engaged with, without the electrical part being received in the socket body, the first contact portion, said terminal has one surface and other surface opposite to the one surface, said first contact portion has one surface contacted to the one surface of the terminal or separated therefrom, said mount portion having a second contact portion thereon, said second contact portion having one surface contacting to the other surface of the terminal; and a convex or concave surface formed on a part of the substantially flat surface of the second contact portion so that the first contact portion is adapted to be slid on the convex or concave surface, thereby making longer a wiped width of the movable contact piece.

14. A socket for an electrical part according to claim 13, further comprising an operation member provided for the socket body so as to be movable with respect to the socket body, and wherein said socket body has a receiving portion on which the electrical part is mounted to be received, said movable contact piece is moved towards the receiving portion of the socket body or withdrawn therefrom in accordance with the movement of the operation member, said first contact portion of the movable contact piece being slid on the concave or convex surface while the movable contact piece being moved towards the receiving portion.

15. A socket for an electrical part according to claim 13, wherein said convex or concave surface has a substantially arc or triangular shape in substantially vertical cross section thereof along a sliding direction of the first contact portion of the movable contact piece.

16. A socket for an electrical part comprising:

a socket body in which the electrical part is received;

a contact pin provided for the socket body and formed with a movable contact piece, said movable contact piece being provided with a first contact portion at one end thereof, said first contact portion being contacted to a terminal of the electrical part or separated therefrom;

a mount portion of the contact pin with which, without the electrical part being received in the socket body, the first contact portion is engaged; and a curved surface formed on a part of the mount portion so that the first contact portion is adapted to be slid on the curved surface, thereby making longer a wiped width of the movable contact piece.

* * * * *

UNITED STATES PATENT AND TRADEMARK OFFICE
CERTIFICATE OF CORRECTION

PATENT NO. : 6,386,896 B2
DATED : May 14, 2002
INVENTOR(S) : Sekiguchi

It is certified that error appears in the above-identified patent and that said Letters Patent is hereby corrected as shown below:

The title page showing illustrated figures, should be deleted and substituted therefor the attached title page.

Delete drawing sheets 1-7, and substitute therefor the attached drawing sheets 1-7.

Signed and Sealed this

Sixteenth Day of September, 2003

JAMES E. ROGAN
*Director of the United States Patent and Trademark Office*

(12) United States Patent
Sekiguchi

(10) Patent No.: US 6,386,896 B2
(45) Date of Patent: *May 14, 2002

(54) SOCKET FOR ELECTRICAL PARTS

(75) Inventor: Toshihiko Sekiguchi, Kawaguchi (JP)

(73) Assignee: Enplas Corporation, Saitama-Ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/471,908

(22) Filed: Dec. 23, 1999

(30) Foreign Application Priority Data

Dec. 25, 1998  (JP) .......................................... 10-369388

(51) Int. Cl.[7] .............................................. H01R 11/22
(52) U.S. Cl. ........................ 439/266; 439/72; 439/259
(58) Field of Search .......................... 439/72, 266, 259, 439/264, 265, 70, 71

(56) References Cited

U.S. PATENT DOCUMENTS

| | | | | |
|---|---|---|---|---|
| 5,443,396 A | * | 8/1995 | Tokushige | 439/266 |
| 5,713,751 A | * | 2/1998 | Fukunaga | 439/266 |
| 5,936,418 A | * | 8/1999 | Ideta et al. | 324/755 |
| 6,109,944 A | * | 8/2000 | Takeyama | 439/266 |

* cited by examiner

Primary Examiner—P. Austin Bradley
Assistant Examiner—Alexander Gilman
(74) Attorney, Agent, or Firm—Fish & Richardson P.C.

(57) ABSTRACT

In a socket for an electrical part, an IC package is received in a socket body. A contact pin is provided for the socket body. The contact pin is formed with a movable contact piece having a movable side contact portion. The movable side contact portion is contacted to a terminal of the IC package and separated from the terminal. In the socket, in a state that the IC package is not received in the socket body, a bent portion is formed on a stationary side contact portion such as a mount portion of the stationary contact piece. The movable contact side portion is seated on the stationary side contact portion so that the movable side contact portion is adapted to be slid on the bent portion, thereby making longer a wiped width of the movable side contact portion.

16 Claims, 7 Drawing Sheets